United States Patent
Kim

(10) Patent No.: US 8,909,852 B1
(45) Date of Patent: Dec. 9, 2014

(54) DISABLING WRITE PROTECTION ON A SERIAL PERIPHERAL INTERFACE CHIP

(75) Inventor: Yong Jae Kim, Cupertino, CA (US)

(73) Assignee: Google Inc., Mountain View, CA (US)

( * ) Notice: Subject to any disclaimer, the term of this patent is extended or adjusted under 35 U.S.C. 154(b) by 171 days.

(21) Appl. No.: 13/396,376

(22) Filed: Feb. 14, 2012

Related U.S. Application Data

(60) Provisional application No. 61/582,066, filed on Dec. 30, 2011.

(51) Int. Cl.
*G06F 12/00* (2006.01)
*G06F 12/14* (2006.01)
*G11C 16/22* (2006.01)
*G11C 5/00* (2006.01)

(52) U.S. Cl.
CPC .......... *G06F 12/1416* (2013.01); *G11C 16/22* (2013.01); *G11C 5/005* (2013.01)
USPC ........................................ 711/103

(58) Field of Classification Search
CPC . G06F 12/1416; G06F 12/1425; G11C 16/22; G11C 5/005
See application file for complete search history.

(56) References Cited

U.S. PATENT DOCUMENTS 5,742,935 A * 4/1998 Hazen et al. ................. 711/152
5,835,594 A * 11/1998 Albrecht et al. ............. 713/187
2004/0153601 A1 * 8/2004 Blankenagel ................. 711/103
2006/0248267 A1 * 11/2006 Xie .............................. 711/103
2007/0079094 A1 * 4/2007 Wang ........................... 711/163
2008/0155244 A1 * 6/2008 Shih ............................... 713/2
2008/0162912 A1 * 7/2008 Wang .............................. 713/1
2009/0083486 A1 * 3/2009 Chen et al. .................. 711/115
2010/0049961 A1 * 2/2010 Liao ............................... 713/2
2010/0131707 A1 * 5/2010 Chi et al. ..................... 711/115
2010/0265785 A1 * 10/2010 Lee et al. ..................... 365/229
2012/0117308 A1 * 5/2012 Lou et al. ..................... 711/103
2012/0221766 A1 * 8/2012 Yeh et al. ..................... 711/103

OTHER PUBLICATIONS

"High Speed Small Sectored SPI Flash Memory", Atmel, 2007, retrieved from <http://www.atmel.com/dyn/resources/prod_documents/doc5107.pdf>.

* cited by examiner

*Primary Examiner* — April Y Blair
*Assistant Examiner* — Michael C Kolb
(74) *Attorney, Agent, or Firm* — McDermott Will & Emery LLP

(57) ABSTRACT

Systems and methods for disabling write protection on a serial peripheral interface (SPI) chip are provided. In some aspects, a method includes providing for termination of asserting a hardware write protect pin on the SPI chip by providing for connection of the hardware write protect pin on the SPI chip to a power supply on the SPI chip. The method also includes setting a software write protect enable bit on the SPI chip to indicate that write protection is disabled on the SPI chip. The method also includes reprogramming at least one bit on the SPI chip to a substantially arbitrary value. The at least one bit is different from the hardware write protect pin and the software write protect enable bit.

22 Claims, 3 Drawing Sheets

DISABLING WRITE PROTECTION ON A SERIAL PERIPHERAL INTERFACE CHIP

CROSS-REFERENCE TO RELATED APPLICATIONS

This application claims priority under 35 U.S.C. §119(e) and the benefit of U.S. Provisional Application Ser. No. 61/582,066, filed Dec. 30, 2011, the disclosure of which is incorporated herein in its entirety.

FIELD

The subject technology generally relates to serial peripheral interface flash memory and, in particular, relates to disabling write protection on a write protected serial peripheral interface flash memory chip and writing to the serial peripheral interface flash memory chip.

BACKGROUND

Oftentimes, electronic devices sold to consumers are returned to the manufacturer for return merchandise authorization (RMA) service, for example, for warranty repairs or for resale. Such electronic devices may include serial peripheral interface (SPI) flash memory chips that may store, for example, basic input/output system (BIOS) data. An SPI flash memory chip in an electronic device may need to be write protected to prevent a consumer from inadvertently modifying or deleting the BIOS data or other critical information. However, during the RMA service, a technician may desire to modify or reprogram the write protected SPI flash memory chip. Under one prior approach, the technician may replace the write protected SPI flash memory chip with a different SPI flash memory chip, which may be expensive. As the foregoing illustrates, an approach for an RMA technician to disable write protection on an SPI flash memory chip and to write substantially arbitrary values to the SPI flash memory chip, while allowing the write protection of the SPI flash memory chip to be enforced during the time the SPI flash memory chip is within a consumer's control, may be desirable.

SUMMARY

The disclosed subject matter relates to a machine-implemented method for disabling write protection on a serial peripheral interface (SPI) chip. The method includes providing for termination of asserting a hardware write protect pin on the SPI chip by providing for connection of the hardware write protect pin on the SPI chip to a power supply on the SPI chip. The method also includes setting a software write protect enable bit on the SPI chip to indicate that write protection is disabled on the SPI chip. The method also includes reprogramming at least one bit on the SPI chip to a substantially arbitrary value. The bit(s) that are reprogrammed are different from the hardware write protect pin. The bit(s) that are reprogrammed are also different from the software write protect enable bit.

The disclosed subject matter further relates to a system. The system includes an interface for connecting to an SPI flash memory chip. The system includes one or more processors. The system also includes a memory that includes instructions that, when executed by the one or more processors, cause the one or more processors to implement a method for disabling write protection on the SPI flash memory chip. The instructions include code for providing for termination of asserting a hardware write protect pin on the SPI flash memory chip connected to the interface by providing for connection of the hardware write protect pin on the SPI flash memory chip to a power supply on the SPI flash memory chip. The instructions also include code for setting a software write protect enable bit on the SPI flash memory chip to indicate that write protection is disabled on the SPI flash memory chip. The instructions also include code for reprogramming at least one bit on the SPI flash memory chip to a substantially arbitrary value. The bit(s) that are reprogrammed are different from the hardware write protect pin. The bit(s) that are reprogrammed are also different from the software write protect enable bit.

The disclosed subject matter further relates to a machine-readable medium. The computer-readable medium includes instructions that, when executed by a machine, cause the machine to implement a method for disabling write protection on a serial peripheral interface (SPI) flash memory chip. The instructions include code for detecting, via a general purpose input/output (GPIO) pin on the SPI flash memory chip, that a hardware write protect pin on the SPI flash memory chip is asserted. The instructions also include code for providing for termination of asserting the hardware write protect pin on the SPI flash memory chip by providing for connection of the hardware write protect pin on the SPI flash memory chip to a power supply on the SPI flash memory chip. The instructions also include code for detecting, via the general purpose input/output (GPIO) pin, that the hardware write protect pin is no longer asserted. The instructions also include code for setting a software write protect enable bit on the SPI flash memory chip to indicate that write protection is disabled on the SPI flash memory chip. The instructions also include code for reprogramming at least one bit on the SPI flash memory chip to a substantially arbitrary value. The bit(s) that are reprogrammed are different from the hardware write protect pin. The bit(s) that are reprogrammed are also different from the software write protect enable bit.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The features of the subject technology are set forth in the appended claims. However, for purpose of explanation, several aspects of the disclosed subject matter are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The subject technology is related to disabling write protection on a serial peripheral interface (SPI) chip. The SPI chip may store, among other things, basic input/output system (BIOS) data for a consumer electronic device. The SPI chip may be communicatively coupled to a write protection disabling machine via an interface on the write protection disabling machine. The write protection disabling machine may provide for termination of asserting a hardware write protect pin on the SPI chip by providing for connection of the hardware write protect pin on the SPI chip to a power supply on the SPI chip. The write protection disabling machine may also set a software write protect enable bit on the SPI chip to indicate that write protection is disabled on the SPI chip. The write protection disabling machine may also reprogram at least one bit on the SPI chip to a substantially arbitrary value. The at least one bit that is reprogrammed may be different from the hardware write protect pin and the software write protect enable bit. Advantageously, the subject technology may provide an approach for a return merchandise authorization (RMA) technician, who is in possession of a write protection disabling machine, to disable write protection on an SPI flash memory chip and to write substantially arbitrary values to the SPI flash memory chip. The subject technology may also allow for the write protection of the SPI flash memory chip to be enforced during the time the SPI flash memory chip is within the control of a consumer who lacks a write protection disabling machine.

Figure 1:
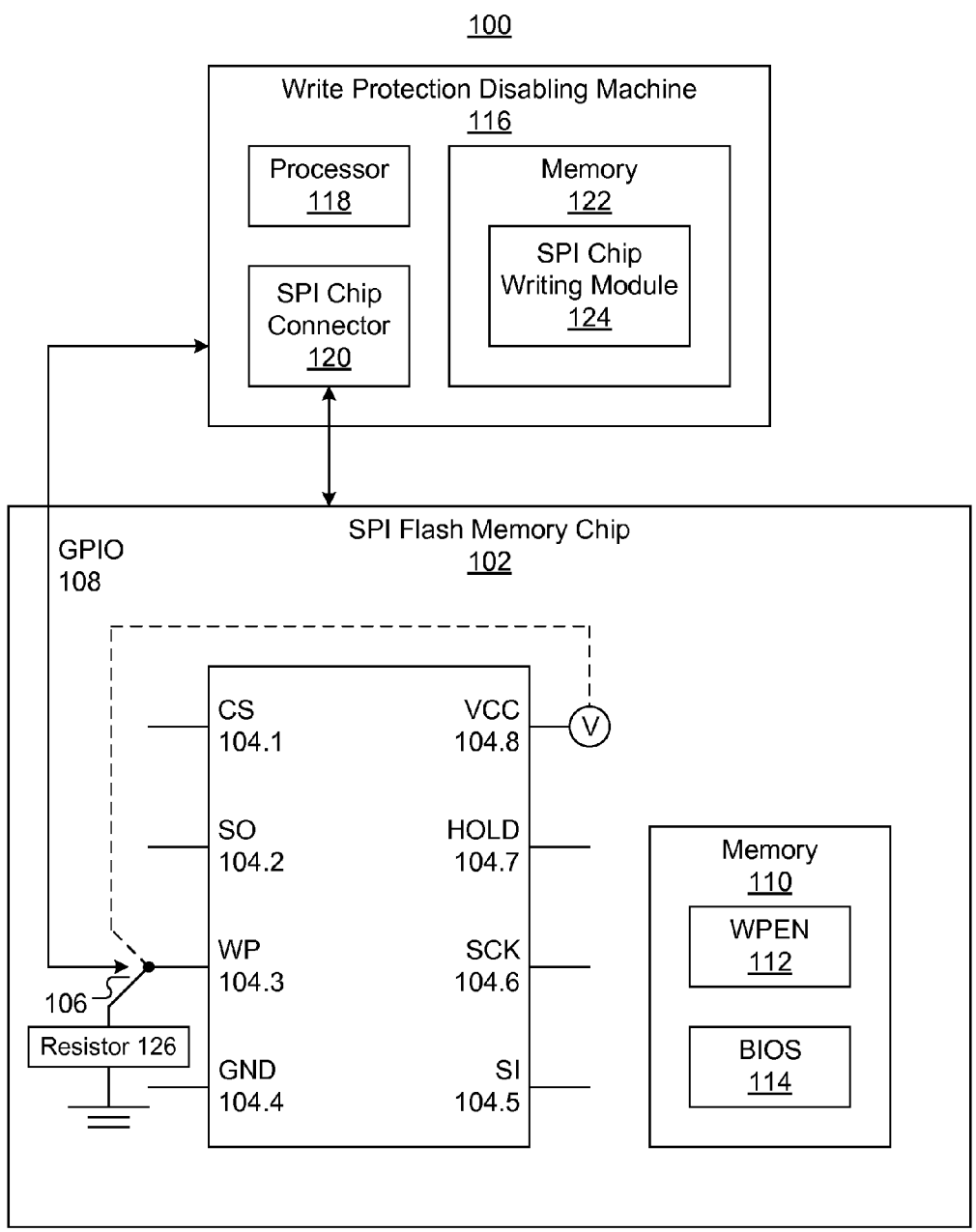
FIG. 1 illustrates an example of a system configured to implement disabling write protection on a SPI chip.

FIG. 1 illustrates an example of a system 100 configured to implement disabling write protection on a SPI chip.

As shown, the system 100 includes a SPI flash memory chip 102 and a write protection disabling machine 116. The write protection disabling machine 116 may be configured to communicatively connect to the SPI flash memory chip 102. The write protection disabling machine 116 may be a separate and distinct component of the system 100 from the SPI flash memory chip 102.

As illustrated, the SPI flash memory 102 includes a plurality of pins 104.1-8, a switch 106 connected to the write protect (WP) pin 104.3, a general purpose input/output (GPIO) pin 108 connected to the WP pin 104.3, and a memory 110.

As shown, the plurality of pins 104.1-8 may be configured as an 8-lead Joint Electron Devices Engineering Council Small-Outline Integrated Circuit (JEDEC SOIC). In an alternative implementation, the plurality of pins may be configured as an 8-lead Small Array Package (SAP) or an 8-lead Ultra Thin Small Array Package. While an 8-lead JEDEC SOIC including eight pins is illustrated, the subject technology may be implemented in conjunction with 16 pins, 32 pins, or any other number of pins. The pins may include a chip select (CS) pin 104.1, a serial data output (SO) pin 104.2, a write protect (WP) pin 104.3, a ground (GND) pin 104.4, a serial data input (SI) pin 104.5, a serial data clock (SCK) pin 104.6, a suspend serial input (HOLD) pin 104.7, and a power supply (VCC) pin 104.8.

The write protect (WP) pin 104.3 may be connected to a switch 106. The switch 106 may be connected to the ground (GND) pin 104.4 on the SPI flash memory chip 102 or to the earth via a resistor 126 to indicate that write protection is enabled on the SPI flash memory chips 102 or that the write protect (WP) pin 104.3 is asserted. To terminate asserting the write protect (WP) pin 104.3, the WP pin 104.3 may be connected to a power supply. The power supply may be a power supply on the SPI flash memory chip 102, for example, power supply (VCC) pin 104.8 or an external power supply. In one implementation, the switch 106 may be configured to disconnect the WP pin 104.3 from the GND pin 104.4 and connect the WP pin 104.3 to the VCC pin 104.8 in order to terminate asserting the WP pin 104.3.

The WP pin 104.3 may also be connected to a general purpose input/output (GPIO) pin 108. The GPIO pin 108 may be configured to communicate whether the WP pin is asserted to a device external to the SPI flash memory chip 102, for example, the write protection disabling machine 116. The GPIO pin 108 may indicate whether the WP pin 104.3 is grounded (e.g., connected to GND pin 104.4 via the switch 106) or connected to a power source (e.g., connected to VCC pin 104.8 via the switch 106).

The SPI flash memory chip 102 may also include a memory 110. The memory 110 may include a write protect enable (WPEN) bit 112 and basic input/output system (BIOS) data 114.

The WPEN bit 112 may be a software indicator of whether write protection is enabled on the SPI flash memory chip 102. For example, write protection may be enabled on the SPI flash memory chip 102 when the WPEN bit 112 is set to 1 or TRUE, and disabled when the WPEN bit 112 is set to 0 or FALSE. In one example, in order to write to the SPI flash memory chip 102, a writing device (e.g., the write protection disabling machine 116) may both connect the WP pin 104.3 to a power supply (e.g., VCC pin 104.8) and set the WPEN bit to 0 or FALSE. In other words, both the software and the hardware write protection may be disabled to write to the SPI flash memory chip 102.

The SPI flash memory chip 102 may be a component in a computing device running an operating system. The BIOS data 114 may include basic input/output system information for the operating system, for example, firmware interface information or booting instructions for the operating system. The BIOS data 114 may also include instructions for identifying devices connected to or included within the computing device, for example, the video display card, the keyboard, the mouse, the hard disk drive, the optical disc drive, or other hardware. The BIOS data may also include user interface instructions for carrying out operating system functions based on user input. The operating system functions based on user input may include, for example, configuring new hardware, setting the clock on the computing device, enabling or disabling components of the computing device, selecting which hardware devices may serve as a potential boot device for the operating system of the computing device, or setting a password or password prompt/hint for the computing device. The BIOS data 114 may also include other data or instructions. In one example, the SPI flash memory chip 102 may store non-BIOS data in addition to or in place of the BIOS data 114.

The write protection disabling machine 116 may be a computing machine. As shown, the write protection disabling machine 116 includes a processor 118, a SPI chip connector 120, and a memory 122. The processor 118 is configured to execute computer instructions that are stored in a computer-readable medium, such as the memory 122. For example, the processor 118 may include a central processing unit (CPU). The SPI chip connector 120 is configured to allow the write protection disabling machine 116 to communicatively connect to a SPI chip, e.g., SPI flash memory chip 102. The SPI chip connector 120 may include, for example, at least one wire configured to connect to the SPI chip or a surface configured to connect to the SPI chip. The memory 122 stores data or instructions. As illustrated, the memory 122 stores an SPI chip writing module 124.

The SPI chip writing module 124 may include instructions for disabling write protection and writing to an SPI chip (e.g., SPI flash memory chip 102) that is communicatively connected to the write protection disabling machine 116 via the SPI chip connector 120. Specifically, the SPI chip writing module 124 may include instructions for providing for termination of asserting a hardware write protect pin (e.g., WP pin 104.3) on the SPI chip by providing for connection of the hardware write protect pin on the SPI chip to a power supply (e.g., VCC pin 104.8) on the SPI chip. The SPI chip writing module 124 may also include instructions for setting a software write protect enable bit (e.g., WPEN bit 112) on the SPI chip to indicate that write protection is disabled on the SPI chip. The SPI chip writing module may also include instructions for reprogramming at least one bit on the SPI chip to a substantially arbitrary value. The at least one bit may be different from the hardware write protect pin and the software write protect enable bit. One example of the operation of the SPI chip writing module 124 is described in greater detail in conjunction with FIG. 2, below.

Figure 2:
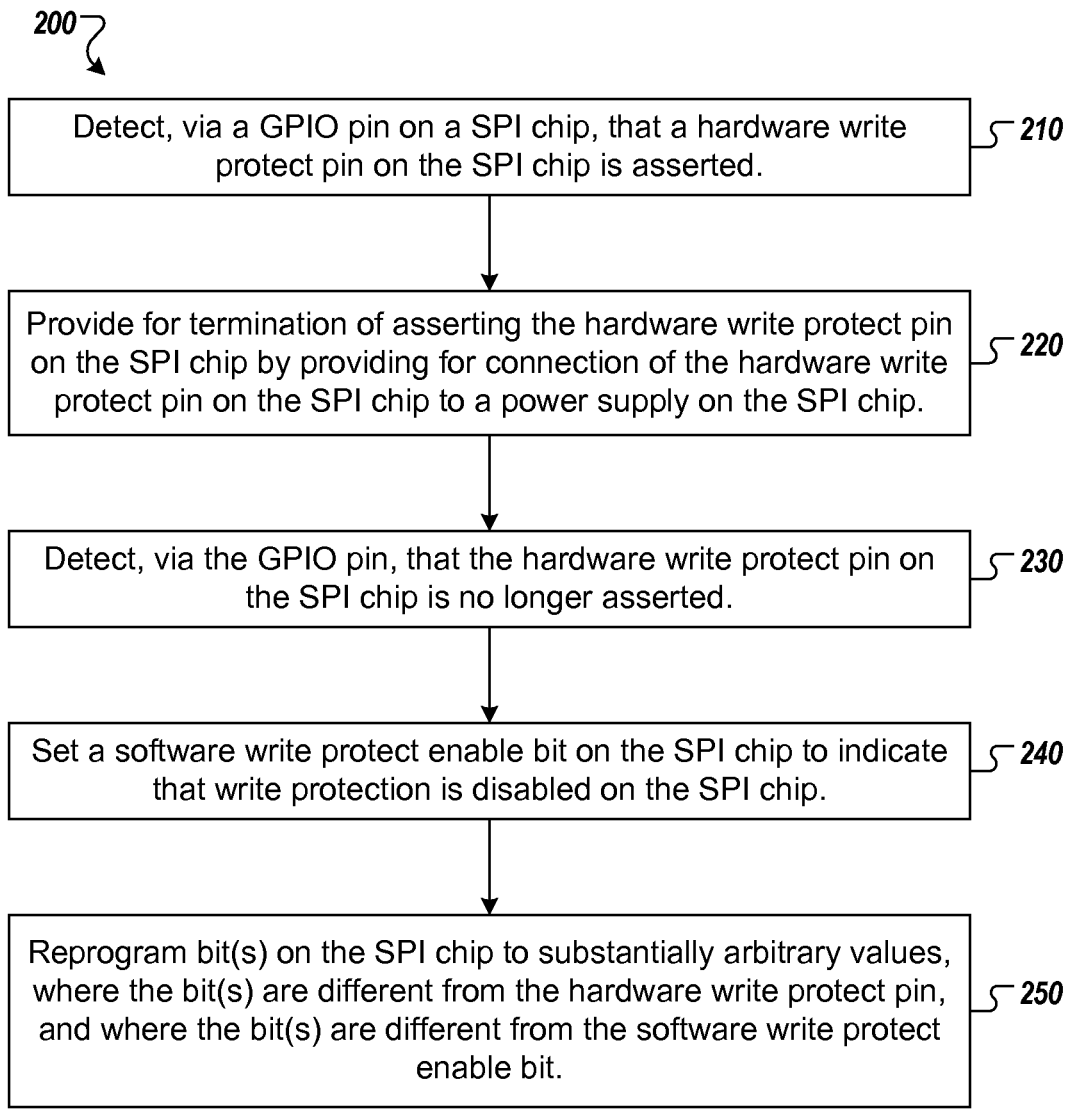
FIG. 2 illustrates an example process by which write protection on a SPI chip may be disabled.

FIG. 2 illustrates an example process 200 by which write protection on a SPI chip may be disabled.

The process 200 begins at step 210, where the write protection disabling machine detects, via a general purpose input/output (GPIO) pin on a serial peripheral interface (SPI) chip, that a hardware write protect (WP) pin on the SPI chip is asserted. The SPI chip may be communicatively coupled to the write protection disabling machine. For example, the SPI chip may be connected to the write protection disabling machine via an interface on the write protection disabling machine for connecting to an SPI chip (e.g., SPI chip connector 120) on the write protection disabling machine. The write protection disabling machine may automatically detect that the SPI chip is connected to the interface. Alternatively, a user of the write protection disabling machine (e.g., a technician) may indicate to the write protection disabling machine that a SPI chip is connected, e.g., by pressing or clicking a button on the user interface of the write protection disabling machine. The SPI chip may be a SPI flash memory chip. The SPI chip may be a separate and distinct component from the write protection disabling machine.

In step 220, the write protection disabling machine provides for termination of asserting the hardware write protect (WP) pin on the SPI chip by providing for connection of the hardware write protect pin on the SPI chip to a power supply on the SPI chip. The power supply on the SPI chip may be a power supply pin (e.g., VCC pin 104.8) on the SPI chip.

In step 230, the write protection disabling machine detects, via the GPIO pin, that the hardware write protect (WP) pin on the SPI chip is no longer asserted. The GPIO pin on the SPI chip may be configured to provide the status of the WP pin on the SPI chip to a receiver external to the SPI chip (e.g., the write protection disabling machine), such that the write protection disabling machine may detect the status of the WP pin via the GPIO pin. In one example, the interface on the write protection disabling machine for connecting to the SPI chip may be configured to communicatively couple with the GPIO pin on the SPI chip.

In step 240, the write protection disabling machine sets a software write protect enable (WPEN) bit on the SPI chip to indicate that write protection is disabled on the SPI chip. The WPEN bit may have two states, 1 or TRUE indicating that write protection is enabled on the SPI chip and 0 or FALSE indicating that write protection is disabled on the SPI chip. The write protection disabling machine may set the WPEN bit to 0 or FALSE.

In step 250, the write protection disabling machine reprograms bit(s) on the SPI chip to substantially arbitrary values. The reprogrammed bit(s) on the SPI chip may be different from the hardware write protect (WP) pin. Also, the reprogrammed bit(s) on the SPI chip may be different from the software write protect enable (WPEN) bit. For example, the reprogrammed bit(s) may include basic input/output system (BIOS) data for an operating system of a computing device associated with the SPI chip. For example, the SPI chip may be a component in the computing device.

In one example, reprogramming bit(s) on the SPI chip to the substantially arbitrary value may involve, receiving, via a graphical user interface, an input including the bit(s) to be reprogrammed and the substantially arbitrary value to which to reprogram the bit(s), and automatically reprogramming the bit(s) based on the input. The bit(s) may be reprogrammed based on the input in real-time. As used herein, the term "real-time" encompasses its plain and ordinary meaning, including, but not limited to without intentional interruption or delay by the processing system. Real-time reprogramming of bits may take less than 1 hour, 30 minutes, 5 minutes, 1 minute, one second, 0.1 seconds, or 0.01 seconds, depending on the number of bits to be reprogrammed, a processing speed of the write protection disabling machine, and/or a processing speed of the SPI chip. The graphical user interface may be a component of the write protection disabling machine. Alternatively, the graphical user interface may be provided externally to the write protection disabling machine, and the write protection disabling machine may need to couple with another device (e.g., a screen, a computer, a mobile phone, etc.) to provide the graphical user interface. After step 250, the process 200 ends.

Figure 3:
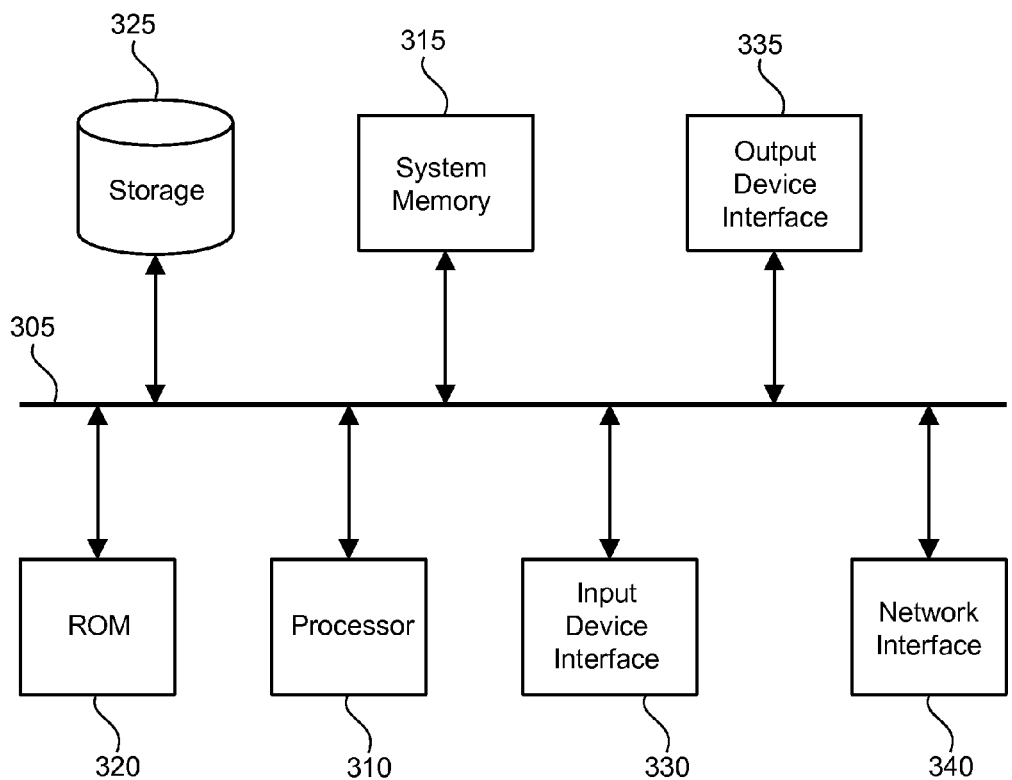
FIG. 3 conceptually illustrates an example electronic system with which some implementations of the subject technology are implemented.

FIG. 3 conceptually illustrates an electronic system 300 with which some implementations of the subject technology are implemented. For example, one or more of the write protection disabling machine 116 or a computer including the SPI flash memory chip 102 may be implemented using the arrangement of the electronic system 300. The electronic system 300 can be a computer (e.g., a mobile phone, PDA), or any other sort of electronic device. Such an electronic system includes various types of computer readable media and interfaces for various other types of computer readable media. Electronic system 300 includes a bus 305, processing unit(s) 310, a system memory 315, a read-only memory 320, a permanent storage device 325, an input device interface 330, an output device interface 335, and a network interface 340.

The bus 305 collectively represents all system, peripheral, and chipset buses that communicatively connect the numerous internal devices of the electronic system 300. For instance, the bus 305 communicatively connects the processing unit(s) 310 with the read-only memory 320, the system memory 315, and the permanent storage device 325.

From these various memory units, the processing unit(s) 310 retrieves instructions to execute and data to process in order to execute the processes of the subject technology. The processing unit(s) can be a single processor or a multi-core processor in different implementations.

The read-only-memory (ROM) 320 stores static data and instructions that are needed by the processing unit(s) 310 and other modules of the electronic system. In one implementation, the ROM 320 may be replaced with a flash memory unit, e.g., a SPI flash memory unit. The permanent storage device 325, on the other hand, is a read-and-write memory device. This device is a non-volatile memory unit that stores instructions and data even when the electronic system 300 is off. Some implementations of the subject technology use a mass-storage device (for example a magnetic or optical disk and its corresponding disk drive) as the permanent storage device 325.

Other implementations use a removable storage device (for example a floppy disk, flash drive, and its corresponding disk drive) as the permanent storage device 325. Like the permanent storage device 325, the system memory 315 is a read-and-write memory device. However, unlike storage device 325, the system memory 315 is a volatile read-and-write memory, such a random access memory. The system memory 315 stores some of the instructions and data that the processor needs at runtime. In some implementations, the processes of the subject technology are stored in the system memory 315, the permanent storage device 325, or the read-only memory 320. For example, the various memory units include instructions for disabling write protection on a write protected serial peripheral interface chip and writing to the serial peripheral interface chip in accordance with some implementations. From these various memory units, the processing unit(s) 310 retrieves instructions to execute and data to process in order to execute the processes of some implementations.

The bus 305 also connects to the input and output device interfaces 330 and 335. The input device interface 330 enables the user to communicate information and select commands to the electronic system. Input devices used with input device interface 330 include, for example, alphanumeric keyboards and pointing devices (also called "cursor control devices"). Output device interfaces 335 enables, for example, the display of images generated by the electronic system 300. Output devices used with output device interface 335 include, for example, printers and display devices, for example cathode ray tubes (CRT) or liquid crystal displays (LCD). Some implementations include devices for example a touchscreen that functions as both input and output devices.

Finally, as shown in FIG. 3, bus 305 also couples electronic system 300 to a network (not shown) through a network interface 340. In this manner, the electronic system 300 can be a part of a network of computers (for example a local area network ("LAN"), a wide area network ("WAN"), or an Intranet, or a network of networks, for example the Internet. Any or all components of electronic system 300 can be used in conjunction with the subject technology.

The above-described features and applications can be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage or flash storage, for example, a solid-state drive, which can be read into memory for processing by a processor. Also, in some implementations, multiple software technologies can be implemented as sub-parts of a larger program while remaining distinct software technologies. In some implementations, multiple software technologies can also be implemented as separate programs. Finally, any combination of separate programs that together implement a software technology described here is within the scope of the subject technology. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, for example microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, for example is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, for example application specific integrated circuits (ASICs) or field programmable gate arrays (FPGAs). In some implementations, such integrated circuits execute instructions that are stored on the circuit itself.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some aspects of the disclosed subject matter, a server transmits data (e.g., an HTML page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of example approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components illustrated above should not be understood as requiring such separation, and it should be understood that the described program components and systems can generally be integrated together in a single software product or packaged into multiple software products.

Various modifications to these aspects will be readily apparent, and the generic principles defined herein may be applied to other aspects. Thus, the claims are not intended to be limited to the aspects shown herein, but is to be accorded the full scope consistent with the language claims, where reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase, for example, an "aspect" does not imply that the aspect is essential to the subject technology or that the aspect applies to all configurations of the subject technology. A disclosure relating to an aspect may apply to all configurations, or one or more configurations. A phrase, for example, an aspect may refer to one or more aspects and vice versa. A phrase, for example, a "configuration" does not imply that such configuration is essential to the subject technology or that such configuration applies to all configurations of the subject technology. A disclosure relating to a configuration may apply to all configurations, or one or more configurations. A phrase, for example, a configuration may refer to one or more configurations and vice versa.

What is claimed is:

1. A machine-implemented method for disabling write protection on a serial peripheral interface (SPI) chip, the method comprising:
   providing for termination of asserting a hardware write protect pin on the SPI chip by providing for connection of the hardware write protect pin on the SPI chip to a power supply on the SPI chip, wherein the hardware write protect pin on the SPI chip is connected to a switch, the switch alternating between connecting the hardware write protect pin to a power supply pin of the SPI chip and connecting the hardware write protect pin to a ground pin on the SPI chip, and wherein, upon connecting, using the switch, the hardware write protect pin to the ground pin, the hardware write protect pin is grounded;
   detecting a status of the hardware write protect pin on the SPI chip via a general purpose input/output (GPIO) pin on the SPI chip, wherein the GPIO pin is connected to the hardware write protect pin;
   setting a software write protect enable bit on the SPI chip to indicate that write protection is disabled on the SPI chip; and
   reprogramming at least one bit on the SPI chip to a reprogrammed value, wherein the at least one bit has a different storage location from the hardware write protect pin and the software write protect enable bit.

2. The method of claim 1, wherein detecting the status of the hardware write protect pin on the SPI chip via the GPIO pin comprises:
   prior to providing for connection of the hardware write protect pin to the power supply, detecting, via the GPIO pin, that the hardware write protect pin is asserted.

3. The method of claim 1, wherein detecting the status of the hardware write protect pin on the SPI chip via the GPIO pin comprises:
   after providing for connection of the hardware write protect pin to the power supply, detecting, via the GPIO pin, that the hardware write protect pin is no longer asserted.

4. The method of claim 1, wherein reprogramming the at least one bit on the SPI chip to the reprogrammed value comprises:
  receiving, via a graphical user interface, an input comprising the at least one bit and the reprogrammed value; and
  automatically reprogramming the at least one bit based on the input.

5. The method of claim 4, wherein automatically reprogramming the at least one bit based on the input comprises:
  automatically reprogramming the at least one bit based on the input in real-time.

6. The method of claim 1, wherein the SPI chip comprises data associated with a basic input/output system (BIOS).

7. The method of claim 1, wherein the SPI chip comprises a SPI flash memory chip.

8. The method of claim 1, wherein a connection between the hardware write protect pin and the power supply pin, through the switch, lacks a resistor.

9. The method of claim 1, wherein a connection between the hardware write protect pin and the power supply pin, through the switch, lacks a capacitor.

10. A system for disabling write protection on a serial peripheral interface (SPI) flash memory chip, the system comprising:
  an interface for connecting to the SPI flash memory chip;
  one or more processors; and
  a memory comprising instructions which, when executed by the one or more processors, cause the one or more processors to:
    provide for termination of asserting a hardware write protect pin on the SPI flash memory chip connected to the interface by providing for connection of the hardware write protect pin on the SPI flash memory chip to a power supply on the SPI flash memory chip, wherein the hardware write protect pin on the SPI chip is connected to a switch, the switch alternating between connecting the hardware write protect pin to a power supply pin of the SPI chip and connecting the hardware write protect pin to a ground pin on the SPI chip, and wherein, upon connecting, using the switch, the hardware write protect pin to the ground pin, the hardware write protect pin is grounded;
    detect a status of the hardware write protect pin on the SPI flash memory chip via the GPIO pin, wherein the GPIO pin is connected to the hardware write protect pin;
    set a software write protect enable bit on the SPI flash memory chip to indicate that write protection is disabled on the SPI flash memory chip; and
    reprogram at least one bit on the SPI flash memory chip to a reprogrammed value, wherein the at least one bit has a different storage location from the hardware write protect pin and the software write protect enable bit.

11. The system of claim 10, wherein the interface for connecting to the SPI flash memory chip comprises at least one wire configured to connect to the SPI flash memory chip.

12. The system of claim 10, wherein the interface for connecting to the SPI flash memory chip comprises a surface configured to connect to the SPI flash memory chip.

13. The system of claim 10, wherein the interface for connecting to the SPI flash memory chip is configured to communicatively couple with a general purpose input/output (GPIO) pin on the SPI flash memory chip.

14. The system of claim 10, wherein the instructions to detect the status of the hardware write protect pin on the SPI flash memory chip via the GPIO pin comprise instructions which, when executed by the one or more processors, cause the one or more processors to:
  prior to executing the instructions to provide for connection of the hardware write protect pin to the power supply, detect, via the GPIO pin, that the hardware write protect pin is asserted.

15. The system of claim 10, wherein the instructions to detect the status of the hardware write protect pin on the SPI flash memory chip via the GPIO pin comprise instructions which, when executed by the one or more processors, cause the one or more processors to:
  after executing the instructions to provide for connection of the hardware write protect pin to the power supply, detect, via the GPIO pin, that the hardware write protect pin is no longer asserted.

16. The system of claim 10, wherein the instructions to reprogram the at least one bit on the SPI flash memory chip to the reprogrammed value comprise instructions which, when executed by the one or more processors, cause the one or more processors to:
  receive, via a graphical user interface, an input comprising the at least one bit and the reprogrammed value; and
  automatically reprogram the at least one bit based on the input.

17. The system of claim 16, wherein the instructions to automatically reprogram the at least one bit based on the input comprise instructions which, when executed by the one or more processors, cause the one or more processors to:
  automatically reprogram the at least one bit based on the input in real-time.

18. The system of claim 16, wherein the at least one bit on the SPI flash memory chip is associated with a basic input/output system (BIOS).

19. The system of claim 16, wherein the graphical user interface is external to the system.

20. The system of claim 10, wherein the SPI flash memory chip is external to the system.

21. A non-transitory machine-readable storage medium for disabling write protection on a serial peripheral interface (SPI) flash memory chip, the machine-readable medium comprising instructions which, when executed by a machine, cause the machine to:
  detect, via a general purpose input/output (GPIO) pin on the SPI flash memory chip, that a hardware write protect pin on the SPI flash memory chip is asserted, wherein the GPIO pin is connected to the hardware write protect pin, wherein the hardware write protect pin on the SPI chip is connected to a switch, the switch alternating between connecting the hardware write protect pin to a power supply pin of the SPI chip and connecting the hardware write protect pin to a ground pin on the SPI chip, and wherein, upon connecting, using the switch, the hardware write protect pin to the ground pin, the hardware write protect pin is grounded;
  provide for termination of asserting the hardware write protect pin on the SPI flash memory chip by providing for connection of the hardware write protect pin on the SPI flash memory chip to a power supply on the SPI flash memory chip;
  detect, via the GPIO pin, that the hardware write protect pin is no longer asserted;
  set a software write protect enable bit on the SPI flash memory chip to indicate that write protection is disabled on the SPI flash memory chip; and
  reprogram at least one bit on the SPI flash memory chip to a reprogrammed value, wherein the at least one bit has a different storage location from the hardware write protect pin and the software write protect enable bit.

22. The non-transitory machine-readable storage medium of claim 21, further comprising instructions which, when executed by the machine, cause the machine to:
automatically detect that the SPI flash memory chip is connected to an interface for connecting to the SPI flash memory chip, wherein the interface for connecting to the SPI flash memory chip is on the machine.

* * * * *